(12) United States Patent
Lee et al.

(10) Patent No.: US 8,323,870 B2
(45) Date of Patent: Dec. 4, 2012

(54) METHOD AND PHOTORESIST WITH ZIPPER MECHANISM

(75) Inventors: Fong-Cheng Lee, Hsinchu (TW); Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 179 days.

(21) Appl. No.: 12/916,759

(22) Filed: Nov. 1, 2010

(65) Prior Publication Data

US 2012/0107742 A1    May 3, 2012

(51) Int. Cl.
G03F 7/00    (2006.01)
G03F 7/004   (2006.01)
G03F 7/40    (2006.01)

(52) U.S. Cl. ............ 430/270.1; 430/330; 430/913; 430/945; 430/331; 430/323; 430/325

(58) Field of Classification Search ............... 430/270.1, 430/322, 323, 325, 330, 331, 913
See application file for complete search history.

(56) References Cited

U.S. PATENT DOCUMENTS

| | | | | |
|---|---|---|---|---|
| 3,984,253 A * | 10/1976 | Nelson | | 430/270.1 |
| 5,225,314 A * | 7/1993 | Waterman et al. | | 430/253 |
| 8,012,400 B2 * | 9/2011 | Mirkin et al. | | 264/494 |
| 2007/0114401 A1 * | 5/2007 | King et al. | | 250/309 |
| 2009/0176175 A1 | 7/2009 | Glodde | | |
| 2010/0082944 A1 * | 4/2010 | Adachi et al. | | 712/200 |
| 2010/0160120 A1 * | 6/2010 | Duchovne | | 482/53 |

OTHER PUBLICATIONS

Tsuda et al., Acid-Catalyzed Degradation Mechanism of Poly(phthalaldehyde):Unzipping Reaction of Chemical Amplification Resist, Journal of Polymer Science:Pat A:Polymer Cheistry, vol. 35, 77-89 (1997).*

Changho Noh et al., "Novel Deep UV Photoresist with Thermally Crosslinkable Photoacid Generator", Advances in Resist Technology and Processing XVIII, Francis M. Houlihan, Editor, Proceedings of SPIE vol. 4345 (2001) © 2001 SPIE—0277/786X/01/$15.00, pp. 536-542.

* cited by examiner

Primary Examiner — Amanda C. Walke
(74) Attorney, Agent, or Firm — Haynes and Boone, LLP

(57) ABSTRACT

The present disclosure provides a resist utilized in a photolithography patterning process. The resist includes a polymeric material having a plurality of zipper molecules, each including a first zipper portion and a second zipper portion, wherein the first and second zipper portions each include a plurality of zipper branches bonded together in pairs and cleavable to one of thermal energy, radiation energy, and chemical reaction.

20 Claims, 9 Drawing Sheets

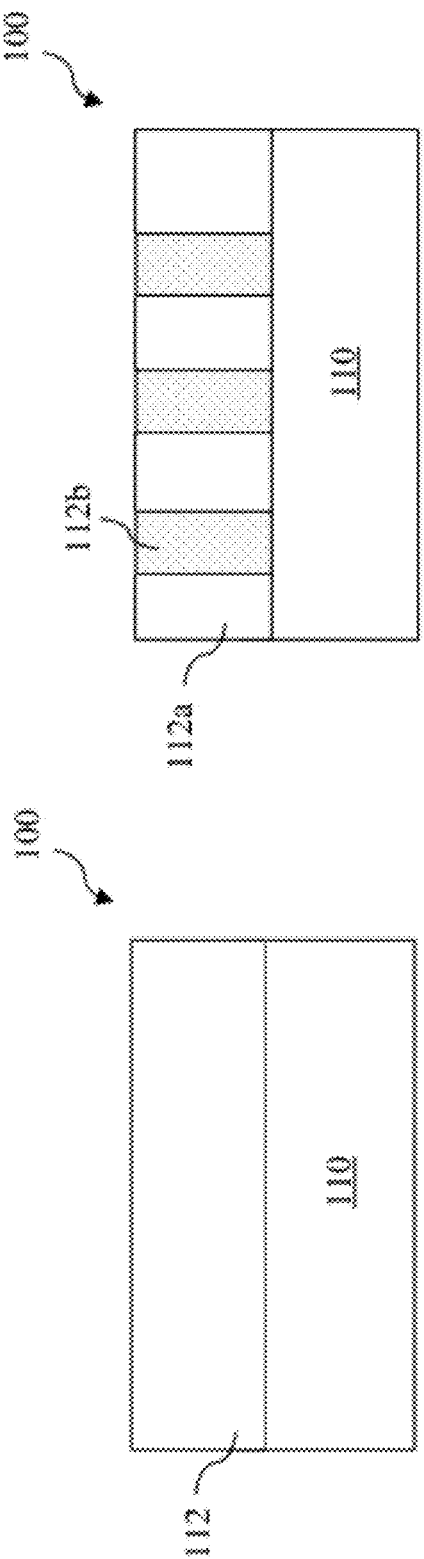

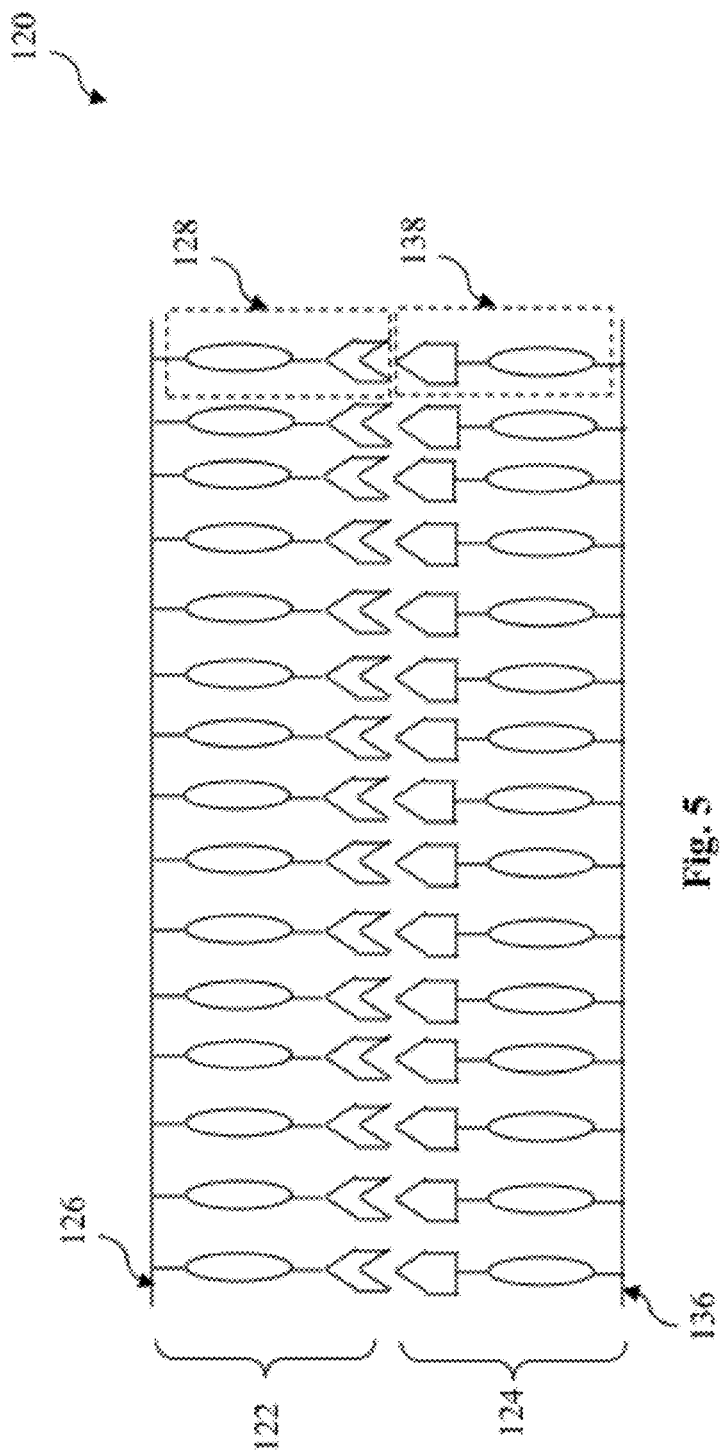

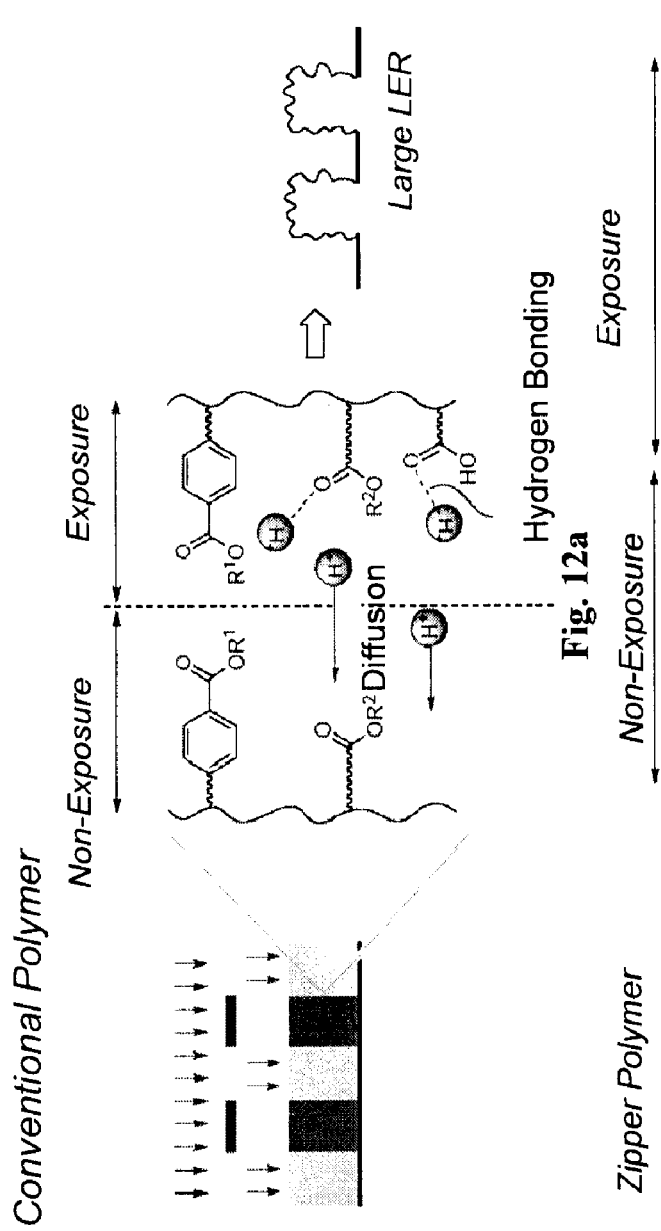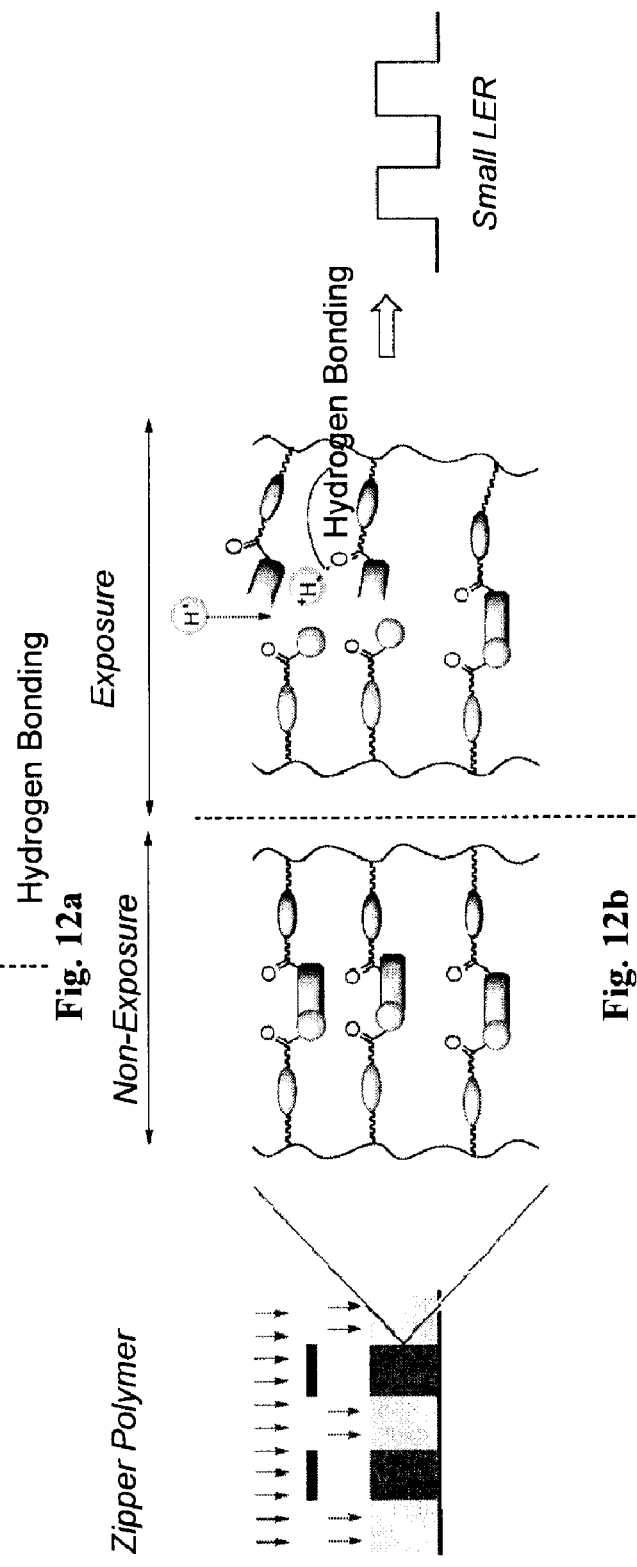
Fig. 12a
Fig. 12b

US 8,323,870 B2

METHOD AND PHOTORESIST WITH ZIPPER MECHANISM

BACKGROUND

Semiconductor technologies are continually progressing to smaller feature sizes, for example, down to 65 nanometers, 45 nanometers, and below. A patterned photoresist layer is used to transfer a designed pattern having small feature sizes from a photomask to a wafer. In a typical chemically amplified (CA) resist, exposing radiation releases acid from a photo-acid generator (PAG) in the CA resist to form a latent image within the resist film. Subsequently, a post exposure bake (PEB) is implemented to drive acid-catalyzed cross-linking or deprotection reactions in the resist film. To enhance resolution of fine patterning of small feature sizes, recent attempts have been made to shorten an exposure light source's wavelength and elevate a projector lens's numerical aperture (in other words, the projector lens has a high numerical aperture). To further elevate the resolution, extreme ultraviolet lithography (EUVL) has been proposed. However, EUVL may suffer out-gassing contamination during higher energy exposing processes, thus leading to contaminated lenses.

Therefore, there is need for a photoresist material and a lithography method to address the above issue.

BRIEF DESCRIPTION OF THE DRAWINGS

Aspects of the present disclosure are best understood from the following detailed description when read in conjunction with the accompanying figures. It is noted that, in accordance with the standard practice in the industry, various features are not drawn to scale. In fact, the dimensions of various features may be arbitrarily increased or reduced for clarity of discussion.

FIGS. 1, 2, 3, and 4 are sectional side views of one embodiment of a substrate, during various fabrication stages.

FIG. 5 is a simplified diagrammatic view of a zipper molecule of a resist according to one or more embodiments.

FIGS. 6 and 7 are simplified diagrammatic views of various parts of the zipper molecule of FIG. 5 constructed according to one or more embodiments.

FIG. 12a is a diagrammatic view of a conventional resist during an exposing process.

FIG. 12b is a diagrammatic view of a zipper resist having the zipper molecules during an exposing process, illustrating the reduction of the line width roughness of the zipper resist by the zipper molecules constructed according to one embodiment.

DETAILED DESCRIPTION

Figure 8:
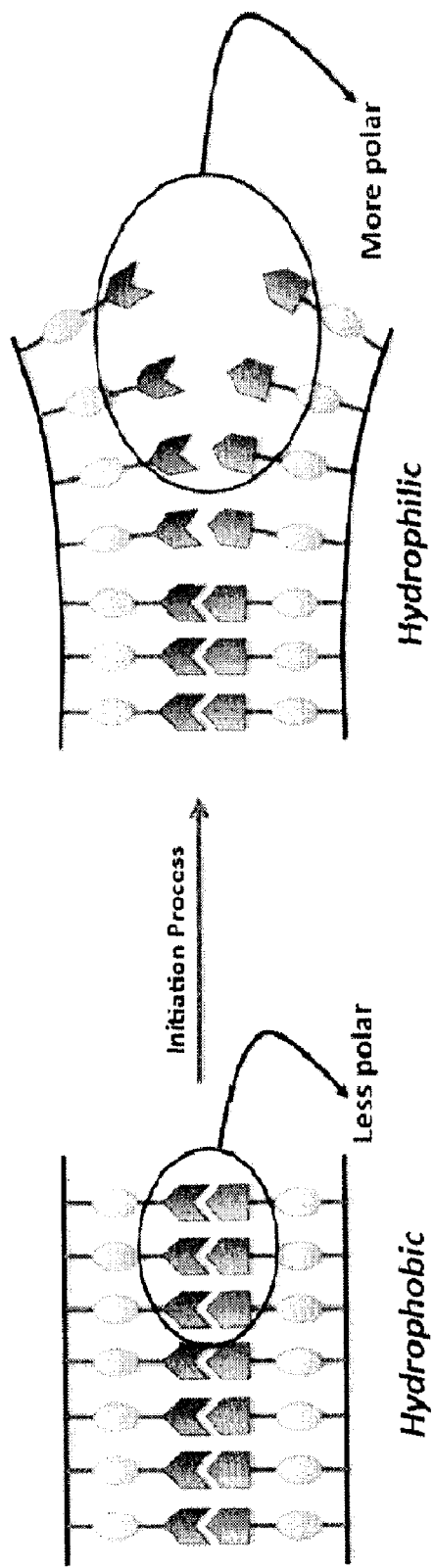
FIG. 8 is a simplified diagrammatic view of the zipper molecule in various states constructed according to various aspects of the present disclosure in one embodiment.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 9:
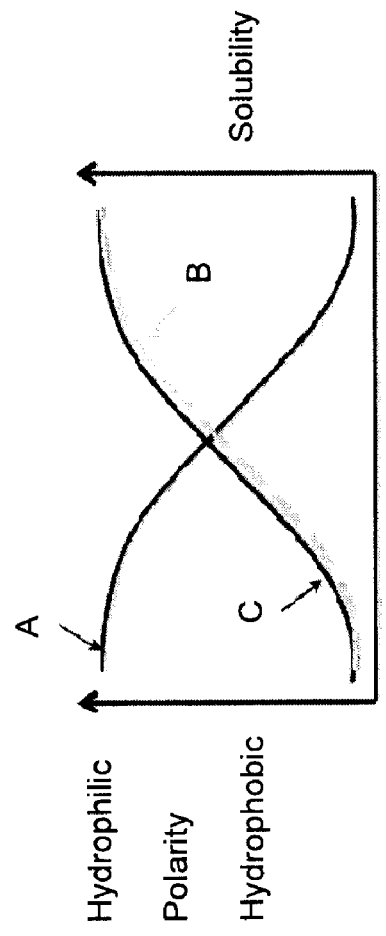
FIG. 9 is a diagram illustrating the polarity and solubility of the zipper molecule at different tuning conditions constructed according to one embodiment.

FIGS. 1-4 are sectional side views showing one embodiment of a substrate 100 during various successive fabrication stages. FIG. 5 is a simplified diagrammatic view of a zipper molecule of a photoresist (or resist) material. FIGS. 6 and 7 are simplified diagrammatic views of various parts of the zipper molecule. FIG. 8 is a simplified diagrammatic view of the zipper molecule in various states. FIG. 9 is a diagram illustrating the polarity and solubility of the zipper molecule at different tuning conditions. With reference to FIGS. 1-9, a lithography patterning method and a resist material utilized in the lithography patterning method are collectively described.

FIG. 1 discloses a semiconductor device 100 having a silicon substrate 110. The substrate 110 may alternatively be made of other suitable semiconductor material, including Ge, SiGe, or GaAs. Further, the substrate 110 may be made of another suitable elementary semiconductor, such as diamond; a suitable compound semiconductor, such as silicon carbide, indium arsenide, or indium phosphide; or a suitable alloy semiconductor, such as silicon germanium carbide, gallium arsenic phosphide, or gallium indium phosphide. The substrate 110 may include various doped regions, dielectric features, and multilevel interconnects. The substrate 110 may alternatively be a non-semiconductor material, such as a glass substrate for thin-film-transistor liquid crystal display (TFT-LCD) devices, or fused quartz or calcium fluoride for a photomask (mask or reticle). The substrate 110 may include one or more other material layers to be patterned, such as a polysilicon layer, a conductive layer, a dielectric layer, or multiple layers of various materials. In various embodiments, the other material layers formed on the substrate 110 include low-k dielectric materials, silicon oxide, silicon nitride, polysilicon, metal, or combinations thereof. In one example, the substrate 110 includes a hard mask layer to be patterned by a lithography process.

The substrate 110 is coated with a photoresist layer (or "resist" layer) 112 having zipper molecules. The resist 112 having zipper molecules is also referred to as zipper resist. The zipper resist layer 112 is formed on the substrate 110 by a suitable technology, such as spin-on coating. In one embodiment, the coated zipper resist layer 112 is baked in a subsequent processing step, such as soft baking. In an embodiment, the zipper resist layer 112 has a thickness ranging between about 300 angstroms and 2000 angstroms. The zipper resist layer 112 can be a positive-type or a negative-type resist. For advanced semiconductor patterning using an extreme ultraviolet (EUV) radiation beam or an e-beam radiation, the zipper resist layer 112 may be a chemical amplification (CA) photoresist.

The zipper resist layer 112 includes a polymeric material as a resist matrix to resist etch when used in an etching process or to resist ion implantation when used in an ion implantation. The polymeric material of the resist layer 112 includes zipper molecules having a zipper mechanism such that the zipper molecules are cleavable upon acid, radiation energy, or thermal energy. With reference to FIG. 5, a zipper molecule 120 is defined as a molecule having a first zipper portion 122 and a second zipper portion 124. The first zipper portion 122 includes a first backbone 126 and a plurality of first zipper branches 128 each being bonded to the first zipper backbone 126, forming a comb-like structure. Referring to FIG. 6, the first zipper branches 128 each include a first chemical group 130 and a first function end 132 bonded to the corresponding first chemical group 130. The second zipper portion 124 includes a second backbone 136 and a plurality of second zipper branches 138 each being bonded to the second zipper backbone 136, forming another comb-like structure. Referring to FIG. 7, The second zipper branches 138 each include a second chemical group 140 and a second function end 142 bonded to the corresponding second chemical group 140. The first function end 132 is chemically bonded to the second function end 142 in pairs as illustrated in FIG. 5. The chemical bonds between each pair of the first and second functional ends are cleavable by photon, acid, base, catalyst, reactant, and/or thermal energy.

The first zipper portion 122 and the second zipper portion 124 each have a molecule weight great enough such that out-gassing issues of photoresist 112 are substantially reduced when the zipper molecule 120 is cleaved during exposure or post exposure baking. In one example, the zipper molecule 120, including both the first and second zipper portions, has a molecule weight ranging between about 300 and about 30,000. In one embodiment, the first and second zipper portions of the zipper molecule 120 each have about 50% of the weight of the zipper molecule 120. In another embodiment, each of the first zipper portion 122 and second zipper portion 124 has a molecule weight greater than about 250.

Referring to FIG. 8, the zipper molecule 120 is substantially hydrophobic and turns to be hydrophilic when it is partially cleaved or completely cleaved. When the zipper molecule 120 is partially or completely cleaved between the first and second functional ends 132/142, the first and second zipper branches 128/138 become charge polarized and capable of hydrogen bonding. Thus, the cleaved or partially cleaved zipper molecule 120 is soluble in water and other polar solvents. Overall, when the zipper resist having the zipper molecules is exposed to a proper energy, such as light or thermal energy, the zipper molecules are cleaved, depending on the energy dosage. The more energy applied to the zipper resist, the more zipper molecules cleaved. Similarly, the more energy applied, the more zipper branches of the zipper molecules cleaved. Accordingly, the polarity and solubility of the zipper resist are increased with the energy dose. FIG. 9 illustrates a zipper resist's polarity and solubility characteristics as an energy dosage, such as exposure dosage or temperature, changes. The horizontal axis represents the energy dosage, increasing from left to right of the horizontal axis. The vertical axis represents polarity and solubility of the zipper resist, increasing from bottom to top of the vertical axis. The zipper molecule 120 will further be described in detail later.

Referring back to FIG. 1, the zipper resist layer 112 includes zipper molecules 120 as polymeric matrix to resist etch or ion implant in various embodiments. The zipper resist layer 112 further includes a radiation-sensitive component. In one embodiment, the photo-sensitive component is photo-acid generator (PAG). PAG is capable of generating acid upon being exposed to light. PAG is distributed in the zipper resist layer 112. In an embodiment, the PAG is chemically bonded with the zipper molecules and diffusion of the PAG is substantially reduced. In an alternative embodiment, the zipper resist 112 includes photo-base generator (PBG), which is capable of generating base upon a proper radiation energy, such as a photon. The zipper resist layer 112 also includes solvent and can be uniformly formed on the substrate 110. After the spin-on coating process, the zipper resist layer 112 may be baked to partially remove the solvent from the zipper resist layer 112.

Referring to FIG. 2, an exposing process is applied to the zipper resist layer 112 using a lithography tool, such as a scanner or stepper. For example, the exposing process may be carried out by exposing the zipper resist layer 112 with a radiation beam through a photomask (or mask) having a predefined pattern (or a reversed pattern). The radiation beam may be ultraviolet (UV), e-beam or extreme ultraviolet (EUV), such as a 248 nm beam from a krypton fluoride (KrF) excimer laser or a 193 nm beam from an argon fluoride (ArF) excimer laser. In an example, the PAG generates acid during the exposing process. The generated acid ($H^+$) can partially cleave the zipper molecules 120 in the zipper resist layer 112.

Referring to FIG. 3, the exposed zipper resist layer 112 may further be treated by a baking process, such as a post exposure baking (PEB). During the PEB process, the zipper resist layer 112 is at a higher temperature. More acids are generated from the photo-generated acids through a chemical amplification process. The zipper molecules of the zipper resist layer 112 in the exposed regions 112c are further cleaved by the acids generated during the PEB. In another embodiment, the thermal energy from the PEB may directly cause the zipper molecules 120 in the exposed regions 112c to be further cleaved.

Referring to FIG. 4, a developing process is applied to the exposed zipper resist layer 112, forming a patterned resist layer 114. During the developing process, a developing solution is applied to the zipper resist layer 112. In one embodiment, the zipper resist layer 112 in the exposed regions 112c are removed during the developing process. In an embodiment, the developing solution is a basic solution, such as tetramethyl ammonium hydroxide (TMAH). In one example, the developing solution includes 2.38% TMAH solution.

During the disclosed lithography patterning process, the zipper resist material having the zipper molecules 120 is used. The zipper molecules 120 are cleavable polymeric molecules when applying photons, acids, or thermal energy. When the zipper molecules 120 are cleaved, the first zipper portion 122 and the second zipper portion 124 are separated from each other. Both the first and second zipper portions 122/124 have molecular weights great enough to eliminate or reduce outgassing issues experienced by conventional photoresists.

Other semiconductor processes may be subsequently implemented using the patterned resist layer 114 as a mask. In one embodiment, an etching process is applied to the substrate 110 using the patterned resist layer as an etch mask. The pattern defined in the patterned resist layer 114 is transferred to the substrate 110 by the etching process. More particularly, a material layer of the substrate 110 is etched and the pattern is transferred to the material layer. In one example, the material layer is a polysilicon layer, a semiconductor layer, or a dielectric layer. In another example, the material layer is a hard mask layer, such as a silicon oxide layer or a silicon nitride layer. The etching process may utilize a wet etching solution, plasma gas, or both. In another embodiment, an ion implantation is applied to the substrate 110 using the patterned resist layer 114 as an implantation mask. The patterned resist layer 114 is then removed by a wet stripping process or plasma ashing process after the etching process or the ion implantation.

In another embodiment, the lithography process includes another tuning step to tune the polarity and solubility of the zipper resist layer 112 before the coating process. In one example, before the coating process, the zipper resist material (in solution) is tuned for an optimized polarity and solubility by applying radiation energy (photons) or thermal energy, such that the zipper molecules in the resist material are partially cleaved. The polarity and solubility of the zipper molecules to water or the water-based solution are increased accordingly. Alternatively or additionally, the tuning process is implemented to the zipper resist layer 112 after the coating process. For example, the tuning process is applied during soft baking or PEB, where the thermal energy causes the zipper molecules 120 in the zipper resist layer 112 to become partially cleaved such that the zipper resist layer's polarity and solubility are optimized for enhanced contrast. The tuning process can be implemented according to various parameters and may be utilized to compensate patterning variations introduced by processing tools, products, or processing recipes. In one example, a thermal treatment is applied to the zipper resist solution to be processed in a lithography tool (such as a stepper) before coating, such that solubility of the zipper resist solution is tuned to compensate for process variations arising from the lithography tool. In another example, a baking process (such as PEB) is adjusted and applied to the zipper resist layer to tune the solubility of the zipper resist layer such that the solubility of the zipper resist layer is modified to compensate for patterning variations arising from the corresponding lithography tool, product, or recipe.

Figure 10:
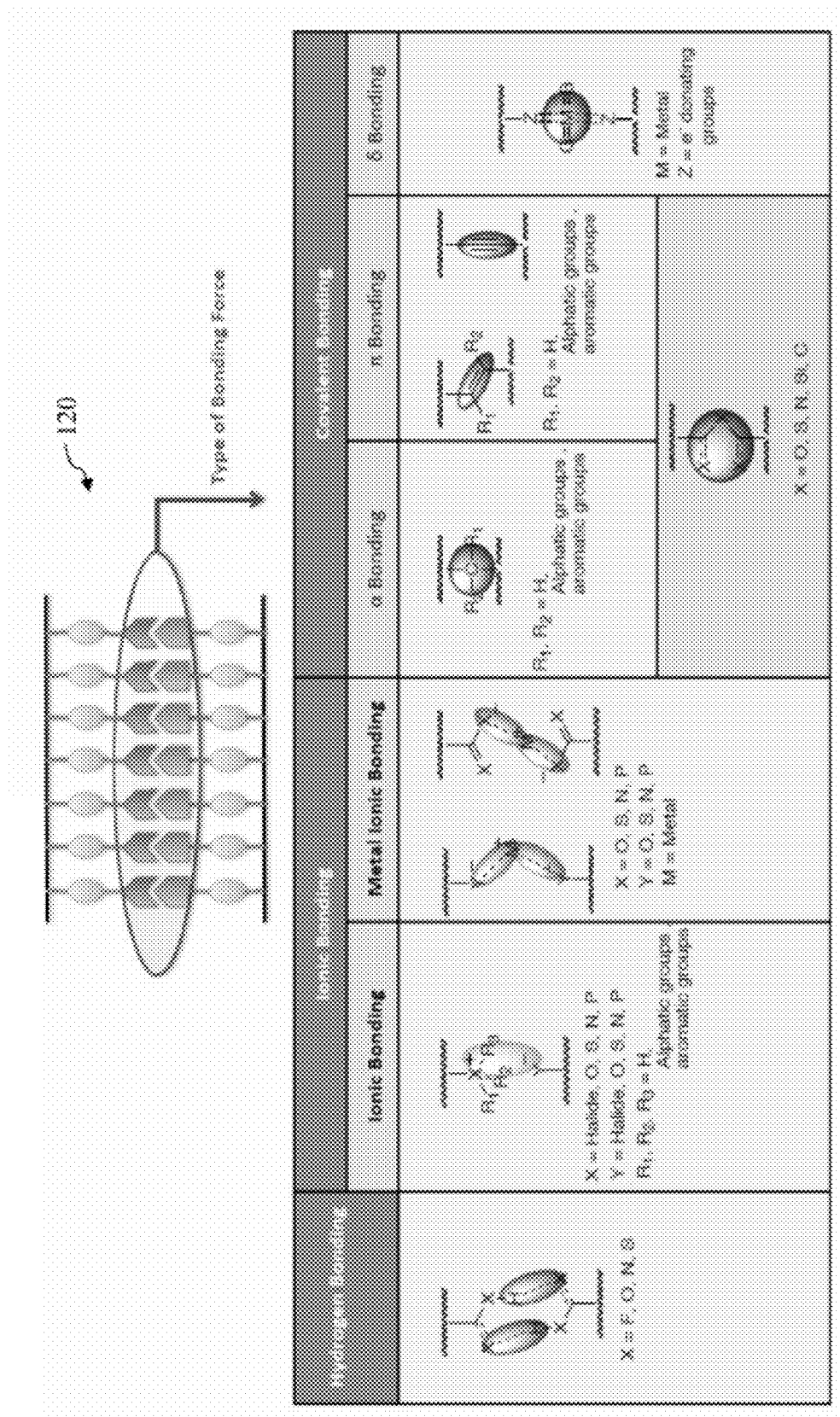
FIG. 10 provides a table of various bonding force of the zipper molecule constructed according to one embodiment.

The zipper molecules 120 in the zipper resist layer 112 is further described in detail according to various embodiments. As illustrated in FIGS. 5-7, the zipper molecules 120 include the first functional ends 132 in the first zipper branches 128 and the second functional ends 142 in the second zipper branches 138. The first and second functional ends 132/142 are bonded together in pairs. In various embodiments, the bonding force includes hydrogen bonding, ionic bonding or covalent bonding as shown in a table of FIG. 10.

When the bonding force is hydrogen bonding, the first and second functional ends include an X component bonded by hydrogen bonding, where the X component includes fluorine (F), oxygen (O), nitrogen (N), or sulfur (S) in various embodiments. In furtherance of the embodiments, the first and second zipper branches (128 and 138) each include a carbon and further include X and X—H components bonded to the carbon (X—H with a single bond and X with a double bond), as illustrated in the first column titled "hydrogen bonding" of FIG. 10. Each paired first and second zipper branches 128 and 138 are bonded together by two hydrogen bonds, each being between X—H and X components.

When the bonding force is ionic bonding, the first zipper branches 128 each include a chemical structure having an $X^+$ component and further having R1, R2, and R3 bonded to the $X^+$ component. X includes halide, O, S, N, or phosphorus (P) in various embodiments. R1, R2 and R3 each include hydrogen, alphatic group, or aromatic group. The second zipper branches 138 each include a $Y^-$ component, where Y includes halide, O, S, N, or P in various embodiments. In furtherance of the embodiments, the chemical structure in the first zipper branch is bonded to the $Y^-$ in the second zipper branch by ionic bonding, as illustrated in the second column titled "ionic bonding" of FIG. 10.

In another embodiment of the ionic bonding, the first and second zipper branches 128 and 138 each include a chemical component $Y^-$ bonded in pairs by $M^+$. M stands for a metal. Y includes O, S, N, or P. In yet another embodiment of the ionic bonding, the first and second zipper branches (128 and 138) each include a carbon and further include two X components bonded to the carbon (one X with a single bond and another X with a double bond). Each paired first and second zipper branches 128 and 138 are bonded together by $M^+$. X includes O, S, N, or P. The above two embodiments of metal ionic bonding are illustrated in the third column titled "metal ionic bonding" of FIG. 10.

When the bonding force is covalent bonding, the first and second zipper branches 128 and 138 are bonded together by $\alpha$, $\pi$, or $\delta$ bonding. The corresponding chemical structures are illustrated in the last three columns of FIG. 10, labeled as "$\alpha$ bonding", "$\pi$ bonding", or "$\delta$ bonding", respectively.

Figure 11:
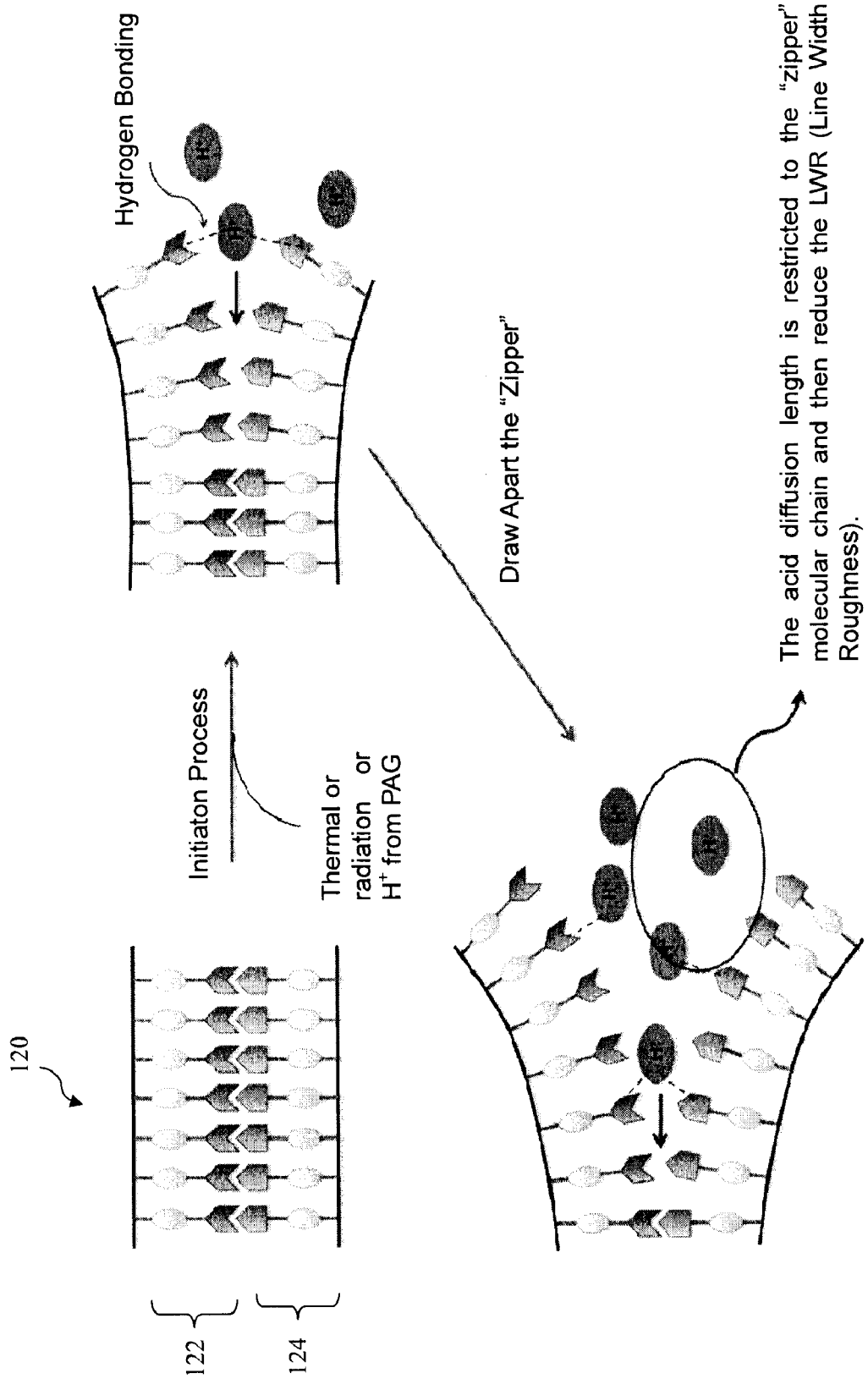
FIG. 11 is a diagrammatic view of the zipper molecule at various stages illustrating the zipper mechanism constructed according to one embodiment.

FIG. 11 schematically illustrates a zipper mechanism to change the polarity of the zipper molecule 120. The first zipper branches 128 of the zipper portion 122 and the second zipper branches 138 of the second zipper portion 124 in the zipper molecule 120 are cleavable by thermal energy, radiation (such as ultraviolet or UV) or acid ($H^+$ from PAG), such that a segment of the zipper molecule 120 is separated between the first and second zipper branches. The separated segment of the zipper molecule 120 releases the corresponding first and second functional ends that are more polarized charges. Thus, the polarity of the zipper molecule 120 is increased and the solubility of the zipper molecule 120 in water or water-based solution is increased as well. The cleaving of the zipper molecule is also referred to as unzipping. In one example, acid generated from PAG can diffuse into a zipper molecule 120 with a diffusion length restricted by the chain of the zipper molecule 120. Therefore, the line width roughness (LWR) is reduced accordingly.

FIGS. 12a and 12b further schematically illustrate the improvement of the line width roughness according to the disclosed zipper material and method. The conventional process flow and resist material are shown in FIG. 12a, in which acid generated by PAG is diffused from one molecule to another molecule. The acid in an exposed region can diffuse into a non-exposed region. The exposure contrast between the exposed regions and non-exposed regions is reduced. The line width roughness is greater due to the acid diffusion among polymeric molecules. In contrast, the zipper resist and method to implement the zipper resist are shown in FIG. 12b, in which acid generated by PAG is substantially trapped or constrained in a zipper molecule due to its zipper structure. The acid diffusion is substantially restricted inside the zipper molecule 120. Thus, the acid diffusion from an exposed region into a non-exposed region is reduced. The exposure contrast between the exposed regions and non-exposed regions is enhanced. Accordingly, the line width roughness is reduced due to the limited acid diffusion in the zipper resist.

Figure 13:
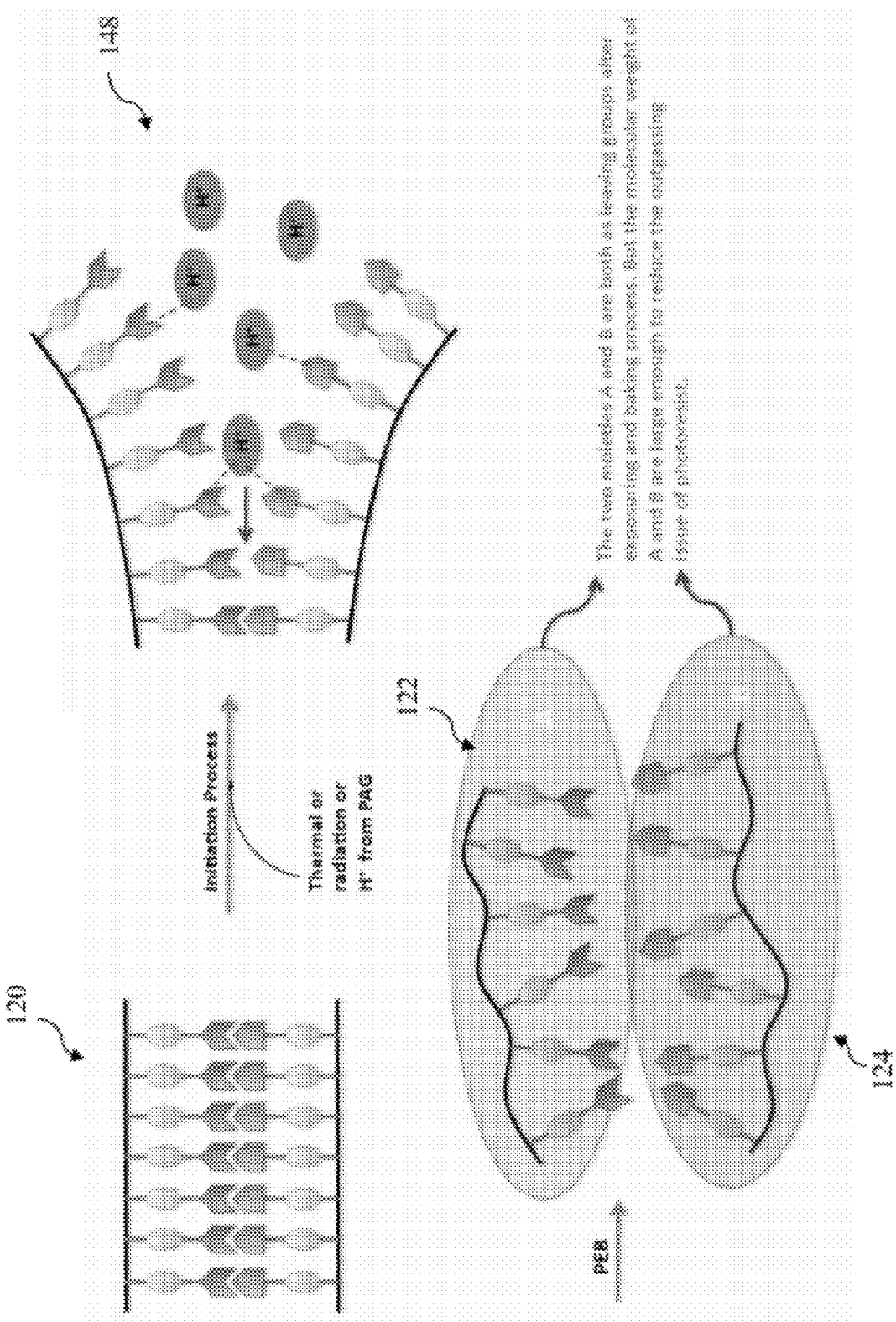
FIG. 13 is a diagrammatic view of the zipper molecule at various stages, illustrating the resist out-gassing reduction by the zipper molecule.

FIG. 13 schematically illustrates zipper resist's mechanism that reduces out-gassing. The zipper molecule 120 is treated by thermal energy, radiation energy, or acid before, during, or after the coating to convert the zipper molecule 120 into a tuned zipper molecule 148 that is partially zipped. The first and second zipper branches 122 and 124 are partially separated with tuned polarity. The zipper molecule 120 in the exposed regions is cleaved during the post exposure baking.

The first zipper portion 122 (moiety A) and the second zipper portion 124 (moiety B) are separated. Since the molecule weights of the first and second zipper portions are large enough, the resist out-gassing issue is reduced.

Figure 14:
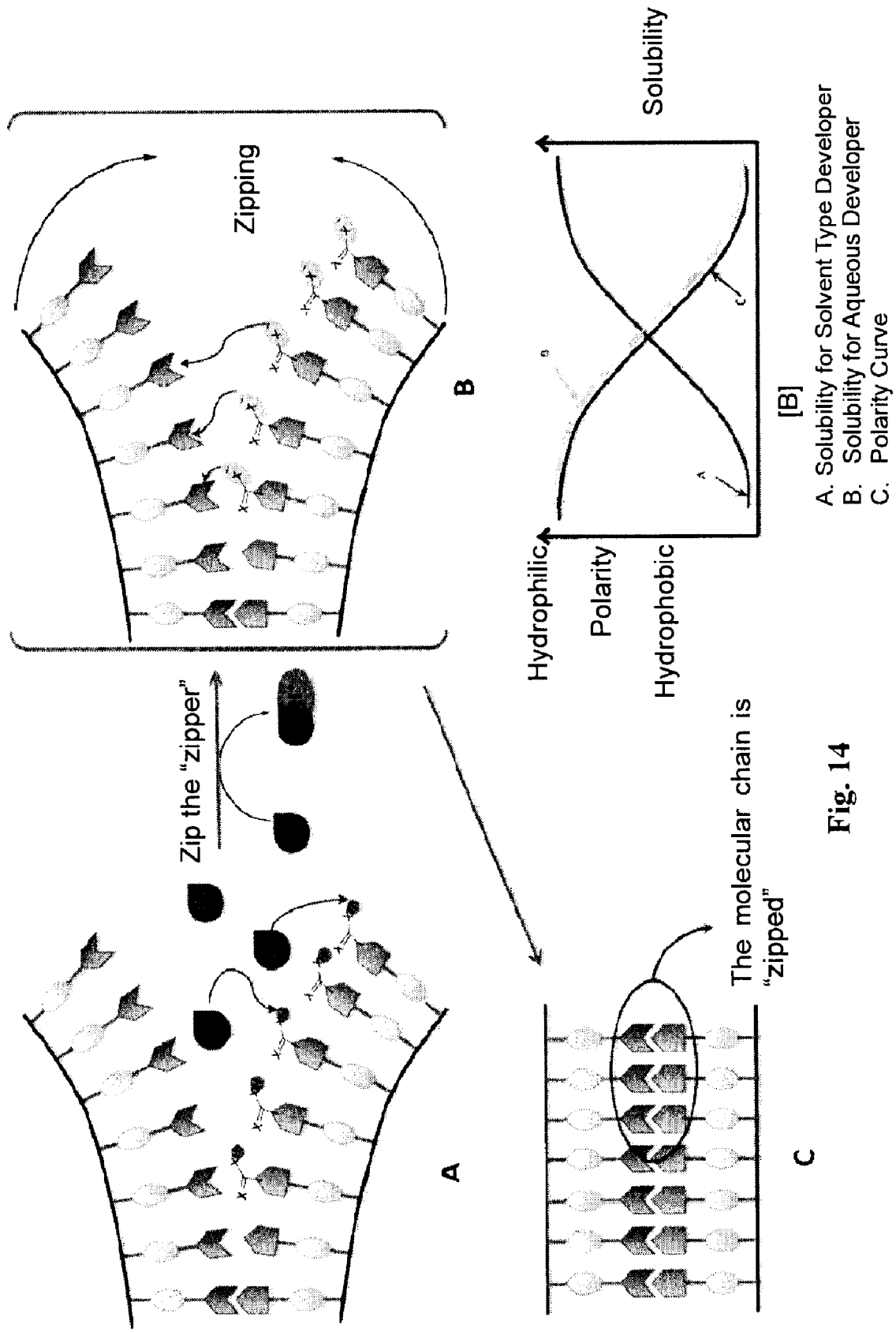
FIG. 14 is a diagrammatic view of the zipper molecule at various stages illustrating the zipper mechanism constructed according to another embodiment.

FIG. 14 is a diagrammatic view of the zipper molecule at various stages illustrating the zipper mechanism constructed according to another embodiment. The zipper molecule is not cleavable (unzipping) to acid, thermal energy, or radiation energy, as illustrated in FIG. 11. The zipper molecule can also be zipped back (also referred to as "zipping") to decrease the polarity of the zipper resist or restore the original polarity. The solubility of the zipper molecule to water or water-based solution is decreased accordingly. In one example, base is used to zip the zipper molecule and is labeled as "B$^-$" in FIG. 14. When base B$^-$ is introduced into the zipper resist, the base will react with H$^+$ in the zipper resist. The base B$^-$ is neutralized with H$^+$, and thus the cleaved zipper molecule recovers the bonding force between the first and second zipper branches. Accordingly, the zipper molecule is zipped as illustrated in FIG. 14. The zipper resist can be tuned to be more hydrophilic or more hydrophobic. The solubility of the zipper resist in water or water-based solution is adjusted in either direction.

Figure 15:
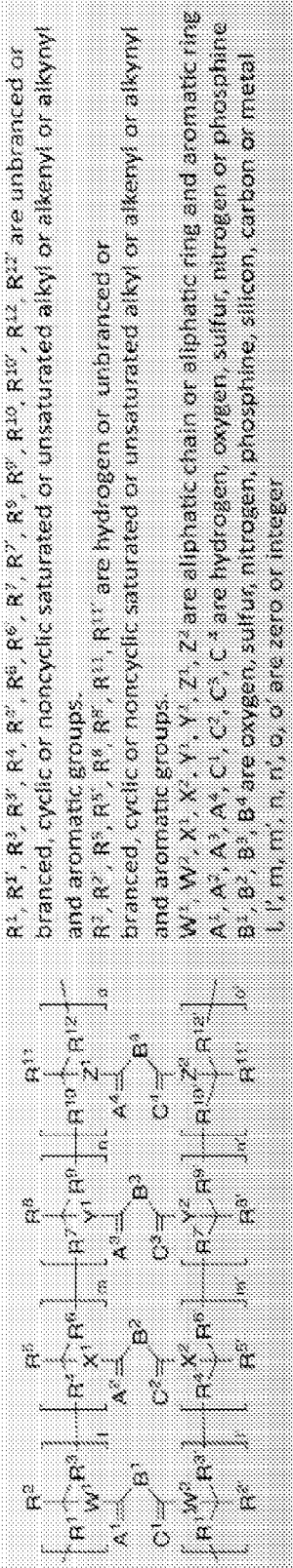
FIG. 15 provides a chemical structure of the zipper molecule constructed according to various aspects of the present disclosure in one or more embodiments.

FIG. 15 schematically provides chemical structures of the zipper molecule constructed according to various embodiments of the present disclosure. The zipper molecule is a polymeric molecule with a formula shown in FIG. 15. In the formula, various functional groups are presented with different symbols and defined in the left portion of FIG. 15.

Various changes, substitutions, and alterations can be made herein without departing from the spirit and scope of the present disclosure. For example, the zipper resist 112 further includes quencher. In another example, the zipper resist 112 further includes chromophore or other suitable additives. In one embodiment, the zipper resist is sensitive to a radiation energy generated from a device selected from the group consisting of a krypton fluoride (KrF) excimer laser, an argon fluoride (ArF) excimer laser, an extreme ultraviolet (EUV) device, and electron beam light source. In another embodiment, the zipper resist 112 includes polyacrylate, poly(methyl methyacrylate), poly(vinyl alcohol), or molecular glasses (MG). In yet another embodiment, the zipper resist 112 can be dissolved by a basic solution, such as 2.38% TMAH after the zipper resist turns more hydrophilic by acid, thermal energy, and/or radiation energy.

In yet another embodiment, as the zipper resist is sensitive to thermal energy and the zipper molecules are cleavable to the thermal energy, the zipper resist can be exposed by the thermal energy. In furtherance of the present embodiment, the lithography patterning process includes forming a zipper resist layer having zipper molecules, exposing the zipper resist layer using a thermal energy to form a latent image, and developing the exposed zipper resist layer, forming a patterned resist layer. In this case, the zipper resist can be patterned without photo-sensitive component. In a particular example, the zipper resist is free of PAG and PBG.

In another embodiment, the zipper molecules can be cleaved into two zipper portions to control the polarity of the zipper resist and the solvent contrast for negative tone development by reacting with electrophiles, irradiating, or thermal treatment. In yet another embodiment, the polarity of the zipper resist can be tuned in an opposite direction such that the polarity is decreased, as illustrated in FIG. 14. In this embodiment, the zipper molecules can be zipped to restore the original polarity or reduce the polarity of the zipper resist and change the solvent contrast for negative tone development by reacting with electrophiles, irradiating, or thermal treatment. The tuning of the polarity of the zipper molecules can include "zipping" or "unzipping" to properly adjust the polarity of the zipper resist.

In another embodiment, the bonding between the first and second zipper branches can be formed at functional ends (132 and 142) or alternatively formed at other locations such as the location between the functional end and the chemical group of the first or second zipper branch. In another embodiment, the plurality of the first zipper branches are chemically different. The plurality of the second zipper branches are chemically different.

In another embodiment, the zipper molecule includes a first moiety and a second moiety bonded together. The first and second moieties are cleavable (unzipping) by applying acid, thermal energy, or radiation energy. The first and second moieties can be zipped by applying a chemical such as base. The polarity and solubility of the zipper resist can be tuned higher or lower. The first and second moieties each have a molecule weight large enough such that resist out-gassing issues are substantially reduced. In one embodiment, the molecule weight of the first moiety is greater than about 250. Similarly, the molecule weight of the second moiety is greater than about 250.

Some of the following advantages and benefits may be present in different embodiments. Those advantages and benefits include reduced resist film loss for negative tone development, straight pattern profile of the pattern resist layer, and ability to tune the resist layer's polarity and solubility.

Thus, the present disclosure provides one embodiment of a resist utilized in a photolithography patterning process. The resist includes a polymeric material having a plurality of zipper molecules each including a first zipper portion and a second zipper portion, wherein the first and second zipper portions each include a plurality of zipper branches bonded together in pairs and are cleavable to one of thermal energy, radiation energy and chemical reaction.

In one embodiment, the resist further includes a radiation-sensitive component bonded with the zipper molecules. In another embodiment, the radiation-sensitive component includes one of photo-acid generators and photo-base generators. In yet another embodiment, the radiation sensitive component includes thermal-sensitive molecules. In yet another embodiment, the radiation energy includes ultra-violet (UV) light. The resist further includes a solvent distributed in the polymeric material. Each of the first and second zipper branches includes a polarized charge. The first and second zipper branches are bonded with one of hydrogen-bonding, ionic bonding, and covalent bonding. In yet another embodiment, the zipper molecules each have a molecule weight ranging between about 300 and about 30000.

The present disclosure also provides another embodiment of a resist utilized in a lithography patterning process. The resist includes a plurality of zipper molecules to cleavable by acid; and photo-acid generators (PAG) each being bonded with one of the zipper molecules.

The zipper molecules each includes a first moiety and a second moiety and a second moiety, the first and second moieties being bonded together, being cleavable to tune polarity of the resist and being large enough to substantially reduce out-gassing issue according to one embodiment. In another embodiment, the first and second moieties each include a molecule weight greater than about 250. In yet another embodiment, each of the first and second moieties includes a backbone being hydrophobic and a plurality of zipper branches, each of the zipper branches having a first end bonded to the backbone and a second end being hydrophilic. In another embodiment, the zipper branches of the first moiety and the zipper branches of the second moiety are boned in pairs and cleavable by one of thermal energy, radiation energy and $H^+$.

The present disclosure also provides an embodiment of a lithography patterning method. The method includes forming a resist layer on a substrate, the resist layer having a plurality of zipper molecules and a radiation-sensitive component; and exposing the resist layer using a radiation energy.

In one embodiment, the method further includes tuning polarity of the zipper molecules by applying one of acid, thermal energy and radiation energy. In another embodiment, the tuning polarity of the zipper molecules is implemented before the forming of the resist layer on the substrate. In yet another embodiment, the tuning polarity of the zipper molecules is implemented during a baking process after the forming of the resist layer on the substrate. The method further includes baking the resist layer after the exposing the resist layer; and developing the resist layer after the baking of the resist layer, forming a patterned resist layer. In another embodiment, the method further include etching the substrate using the patterned resist layer as an etching mask. The patterned resist layer may be removed by wet stripping or plasma ashing after the etching.

The foregoing has outlined features of several embodiments so that those skilled in the art may better understand the foregoing detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A resist utilized in a photolithography patterning process, comprising:
    a polymeric material having a plurality of zipper molecules each including a first zipper portion and a second zipper portion, wherein the first and second zipper portions each include a plurality of zipper branches bonded together in pairs and cleavable to one of thermal energy, radiation energy, and chemical reaction.

2. The resist of claim 1, further comprising a radiation-sensitive component bonded with the zipper molecules.

3. The resist of claim 2, wherein the radiation-sensitive component includes one of photo-acid generators and photo-base generators.

4. The resist of claim 2, wherein the radiation sensitive component includes thermal-sensitive molecules.

5. The resist of claim 1, wherein the radiation energy includes ultraviolet (UV) light.

6. The resist of claim 1, further comprising a solvent distributed in the polymeric material.

7. The resist of claim 1, wherein each of the first and second zipper branches includes a polarized charge.

8. The resist of claim 1, wherein the first and second zipper branches are bonded with one of hydrogen-bonding, ionic bonding, and covalent bonding.

9. The resist of claim 1, wherein the zipper molecules each have a molecule weight ranging between about 300 and about 30000.

10. A resist utilized in a lithography patterning process, comprising:
    a plurality of zipper molecules cleavable by acid; and
    photo-acid generators (PAG) each being bonded with one of the zipper molecules.

11. The resist of claim 10, wherein the zipper molecules each include a first moiety and a second moiety, the first and second moieties being bonded together, being cleavable to tune polarity of the resist, and being large enough to substantially reduce out-gassing issue.

12. The resist of claim 11, wherein the first and second moieties each include a molecule weight greater than about 250.

13. The resist of claim 11, wherein each of the first and second moieties includes a backbone being hydrophobic and a plurality of zipper branches, each of the zipper branches having a first end bonded to the backbone and a second end being hydrophilic.

14. The resist of claim 13, wherein the zipper branches of the first moiety and the zipper branches of the second moiety are bonded in pairs and cleavable by one of thermal energy, radiation energy, and $H^+$.

15. A method, comprising:
    forming a resist layer on a substrate, the resist layer having a plurality of zipper molecules and a radiation-sensitive component; and
    exposing the resist layer using a radiation energy.

16. The method of claim 15, further comprising tuning polarity of the zipper molecules by applying one of acid, thermal energy, and radiation energy.

17. The method of claim 16, wherein the tuning polarity of the zipper molecules is implemented before the forming of the resist layer on the substrate.

18. The method of claim 16, wherein the tuning polarity of the zipper molecules is implemented during a baking process after the forming of the resist layer on the substrate.

19. The method of claim 15, further comprising:
    baking the resist layer after the exposing the resist layer; and
    developing the resist layer after the baking of the resist layer, forming a patterned resist layer.

20. The method of claim 19, further comprising etching the substrate using the patterned resist layer as an etching mask.

* * * * *